ALUMINA PALLADIUM COMPOSITE

Filed Feb. 18, 1971

INVENTORS
PAUL R. THEOBALD
JOSEPH T. BAILEY
BY Kinney, Alexander, Sell, Steldt & DeLaHunt
ATTORNEYS 3,723,176

ALUMINA PALLADIUM COMPOSITE

Paul R. Theobald, Chattanooga, and Joseph T. Bailey, Hixson, Tenn., assignors to American Lava Corporation, Chattanooga, Tenn.

Continuation-in-part of applications Ser. No. 831,911, June 10, 1969, now abandoned, and Ser. No. 834,803, June 19, 1969, now Patent No. 3,627,547. This application Feb. 18, 1971, Ser. No. 116,604
Int. Cl. B44d *1/18;* C04b *33/26*
U.S. Cl. 117—212 5 Claims

ABSTRACT OF THE DISCLOSURE

Intermediate alumina substrates containing buried palladium conductor patterns and adapted for thick or thin film hybrid integrated circuits are provided which can be fired in air i.e., under normal oxidizing conditions, and yet in which the ceramic of the substrate matures without adversely affecting buried palladium circuits.

This application is a continuation-in-part of copending applications Ser. No. 831,911 filed June 10, 1969, now abandoned, and Ser. No. 834,803, filed June 19, 1969, now U.S. Pat. 3,627,547.

This invention relates to thick or thin film hybrid integrated circuits and particularly to intermediate alumina substrates including buried circuitry and termination lands which can be fired in air and a process for making them. In particular this invention relates to a process for producing alumina substrates for package headers having buried an exposed palladium conductors, which may be clad with other metals, the substrates being adapted for application of thick or thin film passive components which are fired in air at about 700° to 1000° C. or for the application of other thick or thin film conductors or components. Provision may be made by way of design changes to receive and connect to any desired chips, capacitors, resistors, leads, covers, etc. Complex interconnections of conductors, etc. may be achieved readily using one or more layers of buried connectors.

In the design and construction of devices incorporating complex circuits such as hybrid integrated circuits it is desirable to take advantage of many techniques of fabrication which may be used for convenience of operation or may necessitated by limitations of size, space or shape. Each advance in flexibility of techniques provides benefits greatly out of proportion to the magnitude of the advance.

Complex parts often require several operations. These must be arranged in some sequence such that a later operation will neither undo nor jeopardize the results of an earlier step. A simple and well recognized example is the necessity of avoiding excessive heating of many semiconductor devices. In a longer sequence of steps, each succeeding heating operation must be in a lower temperature range until, in some cases, the final operation involves packaging or sealing an entire assembly at relatively moderate temperatures.

Because of its excellent electrical insulating properties, high thermal conductivity and stability, alumina ($Al_2O_3$) has been selected as a base or substrate for many purposes. It is resistant to high temperatures and is fabricated by skilled technologists into many forms. Because the maturing temperature for 96% and purer alumina is quite high (ca. 1650° C.) it is necessary to use highly refractory electrical conductors in such alumina bodies. Metals such as gold, silver and even palladium, are excluded because they melt below the maturing temperatures of the alumina ceramics and therefore tend to flow together into beads thereby destroying electrical integrity of conductors. Platinum may be used but is relatively expensive. It is usual to use tungsten, molybdenum or manganese-molybdenum compositions. These are refractory as to melting but oxidize readily so that heating above about 400° to 500° C. requires a reducing atmosphere such as cracked ammonia, i.e., $H_2$ and $N_2$. As a result, substrates in which the conductors are, for example, tungsten, must be handled so that heating above about 400° to 500° C. is performed in a reducing atmosphere. This is a distinct handicap to the manufacturer who is using the substrates for further operations in that specialized heating facilities are more expensive to build, to operate and to maintain. For small runs the cost may be excessive.

Among the noble metals which are good electrical conductors, palladium is especially useful because it is relatively less expensive than platinum and yet melts at about 1550° C. without any oxidation. Gold and silver are much lower melting. The melting point of 1550° is still too low for use with the standard alumina ceramics which are employed in electronics equipment. In order to avoid "beading" which occurs when palladium melts, maximum process temperatures should be 1475° C.

It is accordingly an aim of this invention to provide alumina ceramics compatable with thick film palladium circuitry and cofirable therewith. Another aim is to provide substrates for package headers for thick film hybrid integrated circuits which can be processed at high temperatures in air. Other objects and aims will be evident from the disclosure hereinelsewhere set forth.

A special ceramic base which possesses excellent electrical and mechanical properties and yet is compatible with palladium circuitry, i.e., matures below 1475° C., and particularly below 1425°–1475° C., is available as a prefired 93% alumina with limited amounts of silica and calcia, and in certain cases magnesia, produced as described and claimed in the copending application of Joseph T. Bailey Ser. No. 834,803, filed June 19, 1969, now U.S. Pat. 3,627,547. It is desirable that the maturing temperature be above about 1300° C. so that the palladium particles of the ink will be sintered together. Alkali metals are avoided in order to avoid the formation of relatively conductive glassy phases which cause undesirably high electrical losses. It is therefore most desirable to employ relatively pure reactive materials such as 99.7% or purer reactive alumina, a relatively pure technical grade of $CaCO_3$, U.S.P. grade of $MgCO_3$ and fine grained silica. Particle sizes of each are preferably about 0.5–10$\mu$ although some larger particles can be tolerated. These are combined in proportions so that the composition after firing includes 93% $Al_2O_3$ and the remaining 7% may be about 3.5% each of CaO and $SiO_2$ or about 2.33% each of CaO, MgO and $SiO_2$, that is substantially equal proportions of the oxides. These proportions are exemplary without intending thereby to exclude equivalent compositions approximating these proportions.

The selected ingredients are first converted to a prefired condition which is herein referred to as a ceramic frit or prefired alumina ceramic composition. The finely powdered reactive oxides and carbonates are wet ball-milled with about an equal weight of water for about 1–4 hours and the pasty mass is dried to a cake either with or without prior filtration to remove part of the liquid. The dried cake is calcined, for example, at about 1100° C. for 2–5 hours, in an electric furnace, and after cooling is crushed to a rough gravel size. The gravel is dry ball-milled (using a conventional grinding aid such as 1% of triethanolamine) with ten-fold of balls for 10–20 hours. The resultant dry powder is a prefired alumina ceramic composition which has been partially reacted by solid state reactions and is therefore less subject to volume changes on firing to maturity. It is therefore also referred to as a partially prefired ceramic material or composition.

The prefired ceramic composition is treated as a ceramic material which may be pressed as a dry powder or may be blended with binders, plasticizers or other materials and then extruded or cast into desired shapes. It may be made into a thin paste-like medium and screened onto previously prepared green or fired substrates. A particularly convenient method is to blend with a polymeric binder, and if desired plasticizers, and cast (e.g., by knife-coating) onto a flexible support as described in U.S. Pat. 2,966,719 to give a leathery green sheet or tape from about 0.1 to 0.8 mm. thick which is especially adapted for use in producing substrates.

A further important feature of the invention is that for surface metallizing a special palladium surface metallizing ink is prepared by combining from about 5 to 20% by weight of the above prefired alumina ceramic composition with a palladium ink containing about 80% pure palladium metal and 20% of vehicle such as 4% ethyl cellulose in terpineol. The ink is thus about 4.5 to 17% alumina, 65–80% palladium and 15–20% vehicle. This ink, sometimes referred to as a cermet metallizing composition, provides highly adherent metallic conductors to which tin-lead solder can be attached. They may be clad with a palladium ink containing no ceramic, or a pure gold ink and other useful inks to provide special ease of application of particular components. The surface conductors and lands are available for attachment of thick film components such as conductors, resistors, dielectrics, etc. for chip components such as capacitors or semi-conductors, for active devices such as diodes, transistors, etc. or integrated circuits. The invention is further explained in the figures.

FIGS. 1 to 6 generally illustrate an example of an intermediate substrate for thick film hybrid integrated circuitry. More complex examples are made for particular uses but do not more clearly illustrate the invention.

Figure 1:
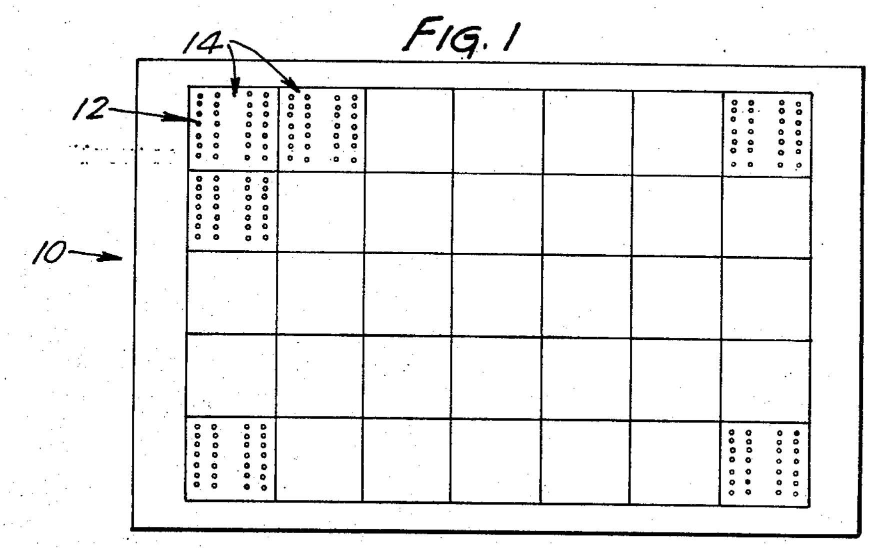
FIG. 1 shows a relatively large sheet or panel of leathery green ceramic sufficient to include 35 small unitary substrates.

Reverting again to the drawings, the leathery green sheet 10 in FIG. 1 is perforated by suitable dies or by laser beams or other convenient means so that it contains desired patterns of via-holes 12. The sheet is suitably of a 93% alumina composition in a binder as described below, the ceramic portion maturing between about 1300° and 1475° C. The space on the sheet is shown laid out to give 35 such unit areas, 14, but it will be recognized that alternative procedures are available for accomplishing the desired multiple perforations and units. These unit areas may also be considered as separate substrates on which particular electrical patterns including buried palladium connectors are formed or developed.

One method for providing holes 12 is to perforate all unit areas simultaneously, another is to perforate each area successively. A least desirable method is to perforate each hole separately inasmuch as in this example this would involve 980 perforations. The unit areas or individual substrates may not be actually physically marked or if desired lines may partially cut through the green sheet 10 (dinking lines). Cutting may be done before firing or by use of laser beams after the entire sheet has been fired. For purposes such as this where several screening operations are involved it is at least convenient to provide indicia so that each operation will be accurately positioned with respect to other operations. It is then convenient to perform operations on all the plurality of units simultaneously although shown with particular reference to one unit for simplicity in FIGS. 2–6 inclusive. Naturally any number of items from one upward may be handled at one time depending on individual size and practical limits for screening, etc. In actual practice a leathery green sheet 10 will often be about 10 x 12.5 cm. and probably in general the maximum number of units to be handled at once will be about 300.

Figure 2:
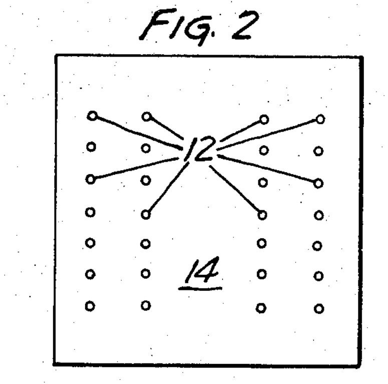
FIG. 2 shows a single substrate of FIG. 1 provided with via-holes in fourteen pairs.

FIG. 2 shows a single substrate or unit, 14, of FIG. 1 enlarged so that all details will be more easily shown. The via-holes, 12, in two columns of seven pairs, are about the same diameter as the thickness of the green sheet 10, that is often about 0.3 to 0.5 mm. (15–20 mils.).

Figures 3X, 4X:
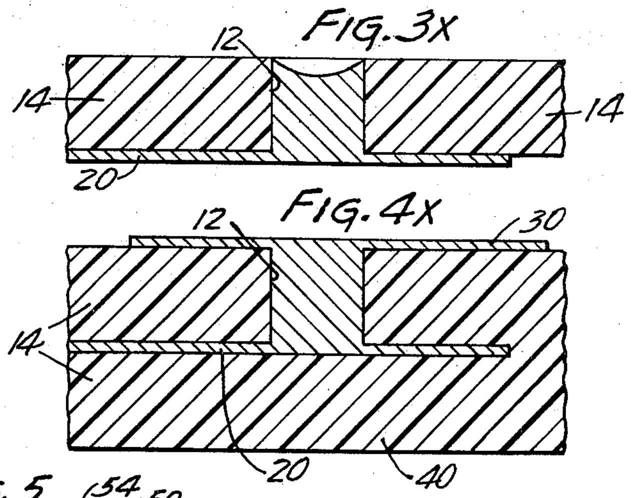
FIG. 3X shows a cross-section through one of the via-holes showing how palladium ink in the reverse face is drawn into the via-holes by capillarity.
FIG. 4X shows a cross-section of a via-hole as in FIG. 3X showing how the application of palladium ink (a special composition as described above) on the obverse fills the via-holes and how an extra layer of insulative ceramic is applied to the reverse.
Figures 3, 4, 5, 5X, 6:
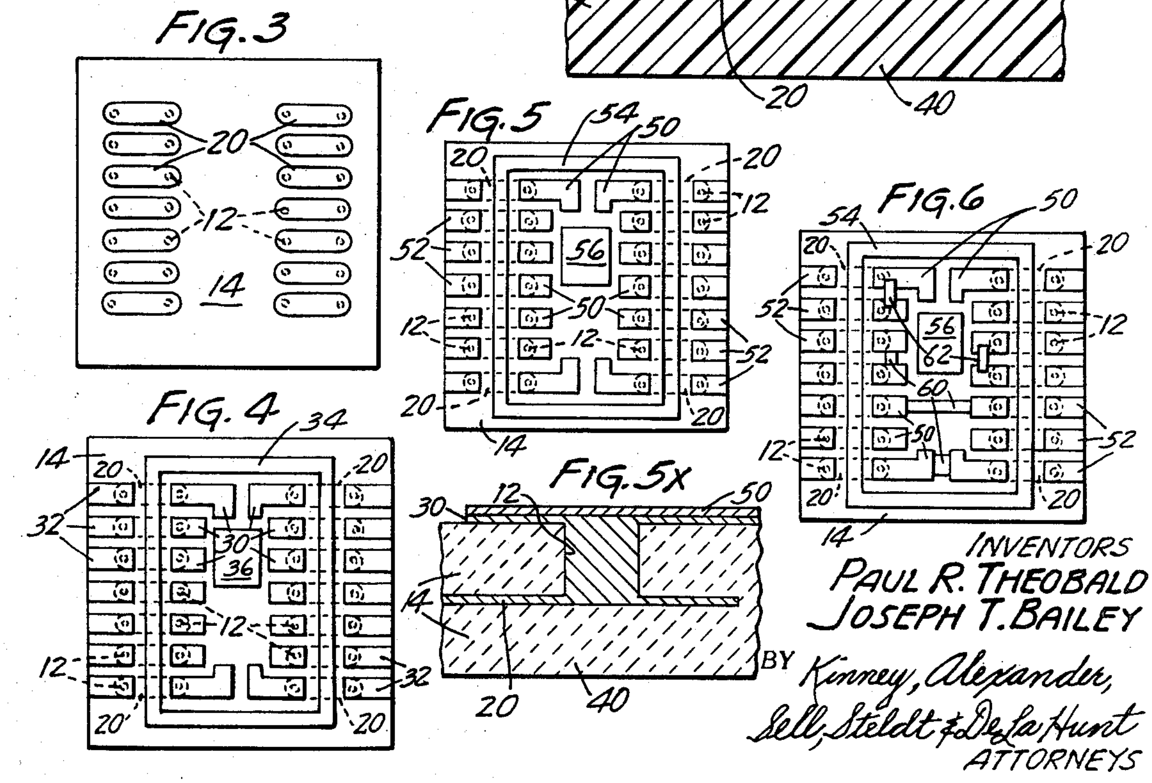
FIG. 3 shows the single unit of FIG. 2 with palladium conductors applied on the reverse surface.
FIG. 4 shows the single unit of FIG. 3 with palladium lands (for connection) applied on the obverse and an extra layer of insulative ceramic applied on the reverse.
FIG. 5 shows the unit of FIG. 4 after firing and after separation from the sheet as shown in FIG. 1 and to which has been applied a pattern in pure gold ink.
FIG. 6 shows an item of FIG. 5 to which have been applied chip capacitors and thick film resistors.

FIG. 3 shows the reverse side of the single unit or substrate, 14, of FIG. 2 on which fourteen connectors 20 have been screened using a pure palladium ink between pairs of via-holes 12. The ink is a suspension of about 80% by weight of essentially pure palladium of about 1.5 to 2.0 micron size in 20% of a 4% solution of ethyl cellulose in terpineol. This composition is used for buried conductors where adhesion is no problem. Other vehicles and binders may be used. Palladium is used as it will sinter to electrically integral conductive films at temperatures of around 1300° C. to 1475° C. at which temperatures the ceramic compositions in these alumina substrates will mature. The ink should be of a consistency such that capillary attraction will cause it to fill via-holes 12 as shown in FIG. 3X which shows a cross-section of a via-hole of FIG. 3 with the connector 20. Note that the basic sheet material is cross-hatched as plastic in FIGS. 3X and 4X because the leathery green sheet is more like plastic than ceramic. In FIG. 5X below, after firing, it is shown as ceramic.

In FIG. 4 a layer of insulative material has been deposited on the reverse face to bury connectors 20. This does not show in this figure which shows the obverse face with external lands 32 and internal lands 30 connected through the via-holes 12 and connectors 20. The internal lands surround an essentially rectangular area in which integrated circuits, etc. can be mounted. The lands 30 and 32 are deposited by screening a palladium ink including ceramic frit as described above. This ink effectively fills the via-holes as shown in the cross-section of FIG. 4X. The differences in the two inks cannot adequately be shown by cross-hatching and they are not distinguished in the figure. The cross-sectional figure also shows the insulative layer 40 burying connectors 20. The insulative layer, 40, may be formed by screening a layer of an ink made from the same alumina composition as used for sheet 10 or it may be a sheet such as sheet 10 without perforations or marking and of the same thickness laminated to sheet 10 before or after screening of lands 30 and 32. The sheet shown is of that thickness. Layer 40 is cross-hatched as plastic in FIG. 4X for the same reason as is sheet 14. It will be recognized that layer 40 may also be thicker than sheet 14 and in fact it may comprise other layers of connectors. Although it is integrally bonded to sheet 40, it is considered distinct for some purposes as, for example, in considering the substrate to be multilayered. In addition, bases 34 and 36 are provided for a ring-frame and pad respectively.

At the condition shown by FIGS. 4 and 4X the substrates may be separated and fired individually, they may be fired as an entire panel or sheet 10 with lines included for break-apart separation, e.g., dinked lines, or the entire sheet may be fired and subsequently be cut apart using a diamond saw or a laser beam. After firing it is not usually convenient to screen coat or manipulate an entire sheet which may have rather too much camber in some portions and be relatively brittle. For purposes of illustration it is considered that individual substrates are separated after firing.

FIGS. 5 and 6 show multilayer substrates of FIG. 4 after firing and are both slightly reduced in size to show shrinkage on firing although the smaller size is not proportioned to normal shrinkages. Likewise FIG. 5X shows reductions in dimensions from FIG. 4X to illustrate the effect of firing. Moreover, cross-hatching of the sheet 14 is for ceramic. The same number 14 is retained to show relationships between figures.

FIG. 5 shows the fired unit after a pure gold pattern (parts numbered 50, 52, 54, 56) has been screened on and sintered at 900–1000° C. (about 10 minutes) to provide bonding pads for soldering and/or welding. The ink employed is suitably a suspension of about 80% of fine gold in 20% of a vehicle such as used for palladium inks. The gold pattern results in changes in appearance so that the lands 30 and 32 of FIG. 4 are now invisible and, instead, gold lands designated 50 and 52 respectively are seen. In addition a pad 56 for eutectic gold silicon chip bonding is provided and a ring-frame 54 for attachment of a lid using gold-tin solder. Pad 56 may be made larger or smaller as required, in this example other thick-film and/or discrete components are contemplated as described below. Via-holes 12 and buried connectors 20 are indicated. FIG. 5X shows a cross-section as in FIG. 4X but slightly reduced in size to show effect of shrinkage on firing. In addition, the substrate 14 including the insulative layer 40 is now shown as ceramic. It will be evident that a separate layer of metal (e.g., gold) has been applied as shown by land 50. The combination of buried palladium conductor in fired alumina ceramic with or without sintered gold overlayer or other cladding is novel.

FIG. 6 shows a more advanced step in manufacture using the intermediate alumina substrate with buried palladium conductors of the invention as shown in FIG. 5. The FIG. 6, all parts identical with those in FIG. 5, are numbered the same. In addition three thick film resistors 60 have been screened on the substrate and fired and two chip capacitors 62 have been attached as shown. Thereafter a semiconductor chip (not shown) is bonded to pad 56 suitably by gold-silicon eutectic soldering at 400° C. and leads of gold or aluminum are used to connect the chip to internal leads 52 using ultrasonic or thermo-compression welding at 310° C. A cap (not shown) is then soldered in place on ring frame 54 using gold-tin eutectic solder at 290° C. The final connections to the completed package (the external lands 52) are made using spring contacts, lead-tin solders or other desired means.

It will be evident from this disclosure that any number of buried palladium conductors may be incorporated in an intermediate alumina substrate together with any desired arrangement of leads, lands and connections and that no special limitations on subsequent operations is thereby imposed. This has not been possible heretofore. Successive operations must be performed at lower temperatures. The advantage of the buried palladium conductors over buried conductors of highly refractory metals such as tungsten and molybdenum (which melt above 2000° C.) is that special precautions to exclude oxygen are unnecessary with palladium whereas tungsten and molybdenum oxidize quite readily above about 400° C. In addition it will be seen that the cermet palladium metallized leads and lands on the surface are inherently more thermally conductive than leads and lands made in which porcelain frits and glassy phases are relied on for adhesion to the substrate. Metal cladding, e.g., with gold, provides lands for attachment by any particularly desired technique so that flexibility in procedures is possible and successive operations can be at successively lower temperatures.

In order that there may be no doubt as to how to prepare an alumina composition suitable for constructing the above substrate the following examples are supplied.

Two partially prefired ceramic compositions are prepared by the above generally described methods in accordance with the following tabulation:

| | Composition | |
|---|---|---|
| | I | II |
| $Al_2O_3$ (99.7%; 1.5μ particles), kg | 1.86 | 1.86 |
| $CaCO_3$, g | 124.2 | 82.7 |
| $MgCO_3$ (U.S.P. precipitated), g | | 109.5 |
| $SiO_2$ (fine ground, 1–2μ), g | 70.0 | 46.6 |
| Water, kg | 2.0 | 2.0 |
| Ball-milled, hours | 2 | 2 |

Both are air dried, calcined, at 1100° C. for 3 hours and crushed to pass 8 mesh screen (small gravel size). Each is dry ball-milled with 20 g. triethanolamine and 10/1 ball/charge ratio for about 10–15 hours.

This finely powdered partially prefired ceramic composition is incorporated with organic binder and solvent as described in U.S. Pat. 2,966,719 mentioned above and cast into a leathery green sheet or tape as described in that patent.

Samples of the leathery green sheet are fired to establish electrical and mechanical characteristics. Composition I matures at about 1400° C. and Composition II at about 1375° C. The ceramics are almost identical in properties with fired density 3.75 g./cc., multicrystalline with average crystal size 1 to 2μ, flexural strength about 50,000 to 75,000 p.s.i. The dielectric constant is 9.63 for each, dissipation factor 0.0004 to 0.0005, loss factor 0.0004 to 0.0005.

Intermediate alumina substrates are prepared by essentially the procedures described above so that, after firing, lands and exposed connectors are of gold clad on palladium and palladium conductors and risers are buried in the ceramic. These substrates are made with positions for mounting discrete chip capacitors etc., for screening thick film resistors, etc. and with open areas, colloquially "real-estate," for other additions. The conductors are found to retain electrical integrity in the fired substrate. The palladium lands containing ceramic are found to be well-adhered to the substrate and the fine gold-cladding on the lands is strongly adherent and an excellent base for attachment of active and passive devices. The conductive risers through the via-holes are electrically integral with buried connectors and with the lands on the surface. Connectors, lands and risers of the substrate are unaffected by oxidizing, neutral or reducing conditions at temperatures up to about 1350° C.

The palladium surface-metallizing ink described above is useful for application to green ceramics as seen and also for application to fired ceramics of various types. It provides adherent areas for subsequent applications of fine gold and to which the pure gold bonds. For example, successive palladium and fine gold patterns are applied to a 99.5% alumina substrate so that soldering and/or welding, such as with gold eutectics, can be used for attaching various devices. In this case the partially prefired ceramic composition in the ink is of the above-described type maturing at 1300° to 1475° C. although the fired ceramic base to which it is applied is of a different composition and may even be quite dissimilar such as beryllia.

What is claimed is:

1. A process for the production of an essentially polycrystalline alumina intermediate substrate having buried palladium conductors and exposed contacts and adapted for attachment of active and passive devices comprising the steps of (1) preparing a dispersion in an organic binder of a finely powdered partially prefired alumina ceramic composition, partially reacted by solid state reaction, composed essentially of 93% alumina with about equal parts each of silica and calcia or of about equal parts of silica, calcia and magnesia and forming said dispersion into a leathery green sheet, (2) screening a first palladium pattern on portions of said leathery green sheet with palladium ink, (3) protecting said pattern with an insulative layer consisting essentially of the same finely powdered partially prefired alumina ceramic composition partially reacted by solid state reaction, (4) providing points of access to said first palladium pattern for electrical connection thereto, (5) screening a further pattern on said portions of said leathery green sheet with an ink in a suitable organic vehicle containing about 65–80% palladium and 4.5 to 17% by weight of the said prefired alumina ceramic composition, said further pattern covering said points of access to said first palladium pattern, and (6) thereafter firing at a temperature in the range of about 1300 to 1475° C. to mature the alumina ceramic composition to a multicrystalline condition and substantially simultaneously to sinter palladium to provide electrically integral buried conductors and exposed contacts in a multicrystalline alumina body essentially free from glassy phases.

2. A process according to claim 1 wherein cladding of a metal sintering below about 1300 to 1475° C. is screened in a selected pattern, at least partially over exposed palladium contacts.

3. A process according to claim 1 wherein cladding of fine gold is screened in a selected pattern, at least partially over exposed palladium contacts, and is sintered at a temperature of about 900° to 1000° C.

4. An intermediate essentially crystalline alumina substrate adapted for attachment of active and passive devices produced by the process of claim 1 having electrically integral buried palladium connectors and exposed palladium contacts connected to said connectors by via-holes.

5. A substrate according to claim 4 wherein palladium contacts are clad with fine gold.

References Cited

UNITED STATES PATENTS

| | | | |
|---|---|---|---|
| 3,189,978 | 6/1965 | Stetson | 106—63 X |
| 3.238,048 | 3/1966 | Somers | 106—46 X |
| 3,516,857 | 6/1970 | Short | 117—212 |
| 3,537,892 | 11/1970 | Milkovich et al. | 117—212 X |
| 3,619,233 | 11/1971 | Hipp | 117—212 X |
| 3,615,763 | 10/1971 | Flock | 264—61 X |
| 3,167,438 | 1/1965 | Bristow | 106—63 X |
| 3,291,619 | 12/1966 | Luks | 106—46 |
| 3,505,134 | 4/1970 | Short | 117—212 X |
| 3,549,784 | 12/1970 | Hargis | 264—61 X |

ALFRED L. LEAVITT, Primary Examiner

K. P. GLYNN, Assistant Examiner

U.S. Cl. X.R.

106—46, 62; 264—61